(12) United States Patent
Litton et al.

(10) Patent No.: US 10,648,077 B2
(45) Date of Patent: May 12, 2020

(54) COATING METHODS AND APPARATUS

(71) Applicant: United Technologies Corporation, Farmington, CT (US)

(72) Inventors: David A. Litton, West Hartford, CT (US); Peter F. Gero, Portland, CT (US); Kevin W. Schlichting, South Glastonbury, CT (US)

(73) Assignee: United Technologies Corporation, Farmington, CT (US)

( * ) Notice: Subject to any disclaimer, the term of this patent is extended or adjusted under 35 U.S.C. 154(b) by 66 days.

(21) Appl. No.: 15/962,173

(22) Filed: Apr. 25, 2018

(65) Prior Publication Data
US 2018/0237910 A1 Aug. 23, 2018

Related U.S. Application Data

(62) Division of application No. 15/222,607, filed on Jul. 28, 2016, now Pat. No. 9,988,716.

(51) Int. Cl.
| | |
|---|---|
| *C23C 16/00* | (2006.01) |
| *C23C 16/455* | (2006.01) |
| *C23C 14/30* | (2006.01) |
| *C23C 14/50* | (2006.01) |
| *C23C 14/56* | (2006.01) |
| *C23C 4/134* | (2016.01) |
| *C23C 16/46* | (2006.01) |

(Continued)

(52) U.S. Cl.
CPC ........ *C23C 16/45525* (2013.01); *C23C 4/134* (2016.01); *C23C 14/30* (2013.01); *C23C 14/505* (2013.01); *C23C 14/568* (2013.01); *C23C 16/46* (2013.01); *F01D 5/288* (2013.01); *F01D 9/02* (2013.01); *F01D 11/08* (2013.01); *F02C 7/24* (2013.01); *F23R 3/002* (2013.01); *F23R 3/28* (2013.01); *C23C 14/083* (2013.01); *F05D 2220/32* (2013.01); *F05D 2230/31* (2013.01); *F05D 2230/90* (2013.01); *F05D 2240/35* (2013.01); *F05D 2300/175* (2013.01)

(58) Field of Classification Search
CPC ..................................................... C23C 16/46
See application file for complete search history.

(56) References Cited

U.S. PATENT DOCUMENTS

| | | |
|---|---|---|
| 3,796,182 A | 3/1974 | Rosier |
| 4,405,659 A | 9/1983 | Strangman |

(Continued)

FOREIGN PATENT DOCUMENTS

| | | |
|---|---|---|
| EP | 2157204 A1 | 2/2010 |
| JP | 0798862 A | 4/1995 |

OTHER PUBLICATIONS

Noriyuki JP07098862 Apr. 1995 Eng machine trans (Year: 1995).*

(Continued)

*Primary Examiner* — Joseph A Miller, Jr.
(74) *Attorney, Agent, or Firm* — Bachman & LaPointe, P.C.

(57) ABSTRACT

An apparatus for depositing a coating on a part comprises: a chamber; a source of the coating material, positioned to communicate the coating material to the part in the chamber; a plurality of thermal hoods; and means for moving a hood of the plurality of thermal hoods from an operative position and replacing the hood with another hood of the plurality of hoods.

19 Claims, 8 Drawing Sheets

(51) Int. Cl.
*F01D 5/28* (2006.01)
*F01D 9/02* (2006.01)
*F01D 11/08* (2006.01)
*F02C 7/24* (2006.01)
*F23R 3/00* (2006.01)
*F23R 3/28* (2006.01)
*C23C 14/08* (2006.01)

(56) References Cited

U.S. PATENT DOCUMENTS

| | | | |
|---|---|---|---|
| 6,060,177 | A | 5/2000 | Bornstein et al. |
| 8,191,504 | B2 | 6/2012 | Blankenship |
| 8,709,160 | B2 | 4/2014 | Neal et al. |
| 8,951,350 | B2 | 2/2015 | Neal et al. |
| 9,133,542 | B2 | 9/2015 | Neal et al. |
| 2001/0027744 | A1 | 10/2001 | Dietze |
| 2004/0082251 | A1 | 4/2004 | Bach et al. |
| 2008/0018236 | A1* | 1/2008 | Arai .................. C23C 14/042 313/504 |
| 2012/0282402 | A1 | 11/2012 | Neal et al. |
| 2014/0183161 | A1* | 7/2014 | Niyogi .................. C23C 16/042 216/45 |

OTHER PUBLICATIONS

"Vacuum Turbine Blade Coating", ALD Vacuum Technologies, Hanau, Germany, retrieved from internet Jul. 13, 2016 http://web.ald-vt.de/cms/vakuum-technologie/anlagen/ebpvd/.

Loading chamber of an EB/PVD system, ALD Vacuum Technologies, Hanau, Germany, retrieved from Internet Jan. 13, 2016 http://web.ald-vt.de/cms/fileadmin/img/metallurgie/eb_pvd/chamber_ebpvd.jpg.

European Search Report dated Dec. 5, 2017 for European Patent Application No. 17182767.8.

Office Action dated Sep. 25, 2017 for U.S. Appl. No. 15/222,607.

* cited by examiner

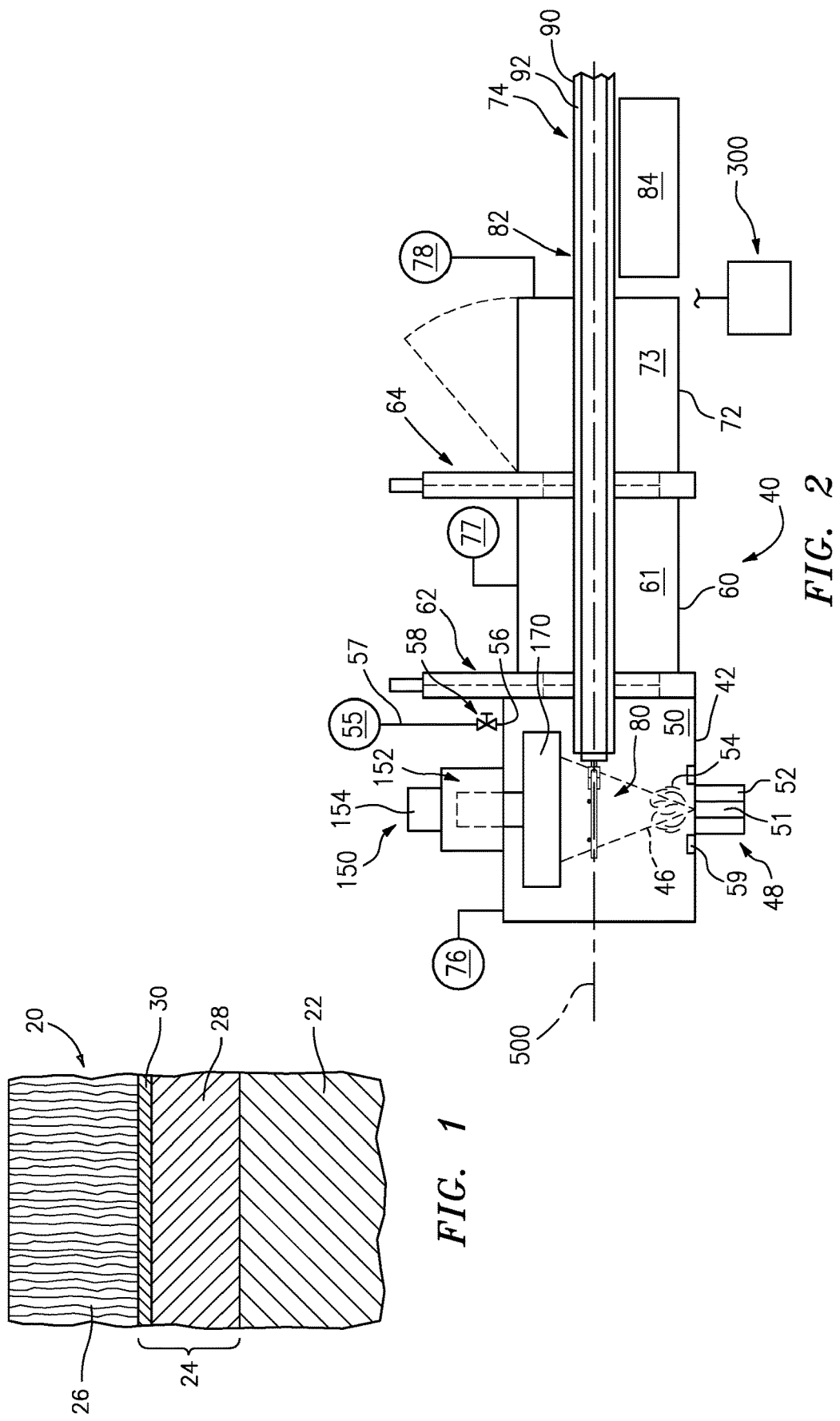

COATING METHODS AND APPARATUS

CROSS-REFERENCE TO RELATED APPLICATION

This is a divisional application of U.S. patent application Ser. No. 15/222,607, filed Jul. 28, 2016, and entitled "Coating Methods and Apparatus", the disclosure of which is incorporated by reference herein in its entirety as if set forth at length.

BACKGROUND

The disclosure relates to coating apparatus and methods. More particularly, the disclosure relates to application of thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes a NiCoCrAlY bond coat (e.g., low pressure plasma sprayed (LPPS)) and a yttria-stabilized zirconia (YSZ) thermal barrier coat (TBC) (e.g., air plasma sprayed (APS)). While the TBC layer is being deposited or during an initial heating cycle, a thermally grown oxide (TGO) layer (e.g., alumina) forms atop the bond coat layer. As time-at-temperature and the number of cycles increase, this TGO interface layer grows in thickness. U.S. Pat. Nos. 4,405,659 and 6,060,177 disclose exemplary systems.

Exemplary TBCs are applied to thicknesses of 5-40 mils (127-1016 micrometer) and can provide in excess of 300° F. temperature reduction to the base metal. This temperature reduction translates into improved part durability, higher turbine operating temperatures, and improved turbine efficiency.

Examples of coating apparatus are found in U.S. Pat. No. 8,709,160, of Neal et al., Apr. 29, 2014, and U.S. Pat. No. 9,133,542, of Neal et al., Sep. 15, 2015, which disclose use of thermal hoods to maintain part temperature. U.S. Pat. No. 8,951,350, of Neal et al., Feb. 10, 2015 discloses a removable hood liner. Thermal hoods are typically either in the form of an arcuate plate or plate assembly (e.g., a sector of a circular cylindrical shell) or a flat top plate or plate assembly.

It is also known to have an adjustable height top plate or hood instead of a fixed hood.

SUMMARY

One aspect of the disclosure involves an apparatus for depositing a coating on a part. The apparatus comprises: a chamber; a source of the coating material, positioned to communicate the coating material to the part in the chamber; a plurality of thermal hoods; and means for moving a hood of the plurality of thermal hoods from an operative position and replacing the hood with another hood of the plurality of hoods.

In one or more embodiments of any of the other embodiments, the source comprises an ingot and an electron source positioned to direct a beam to the ingot.

In one or more embodiments of any of the other embodiments, the apparatus further comprises: a sting assembly for carrying the part and shiftable between: an inserted condition where the sting assembly holds the part within the chamber for coating; and a retracted condition where the sting assembly holds the part outside of the chamber.

In one or more embodiments of any of the other embodiments, the moving comprises transferring the hood to the sting.

In one or more embodiments of any of the other embodiments, the sting assembly comprises: an inner member and an outer member; and an actuator coupled to the inner member to move the inner member relative to the outer member. In one or more further embodiments, the part is held by the inner member.

In one or more embodiments of any of the other embodiments, the plurality of thermal hoods are in a vertical array and the operative position is a lowermost position in the array.

In one or more embodiments of any of the other embodiments, the means comprises a rotatable shaft extending through the plurality of thermal hoods.

In one or more embodiments of any of the other embodiments, the means provides height adjustment of the operative position.

In one or more embodiments of any of the other embodiments, the rotatable shaft is keyed to the plurality of thermal hoods so that sequential rotations of the rotatable shaft sequentially release the hoods from the operative position.

In one or more embodiments of any of the other embodiments, the thermal hoods each comprise: a first member comprising an essentially continuous metallic member; and a second member comprising a foraminate layer spaced below the first metal member.

In one or more embodiments of any of the other embodiments, the first member and second member are secured by wires and/or standoffs.

In one or more embodiments of any of the other embodiments, the first member comprises a plate.

In one or more embodiments of any of the other embodiments, the second member comprises a screen.

In one or more embodiments of any of the other embodiments, a method for using the apparatus comprises, while continuously maintaining vacuum in the chamber, a plurality of operational cycles each comprising: a plurality of part coating cycles; and, with the means, moving a hood from the operative position and replacing it with another hood of the plurality of hoods.

In one or more embodiments of any of the other embodiments, the plurality of part coating cycles each comprise: installing one or more parts to the sting assembly in the retracted condition; shifting the sting assembly to the inserted condition; coating the one or more parts; after the coating, retracting the sting assembly from the inserted condition to the retracted condition; and removing the one or more parts.

In one or more embodiments of any of the other embodiments, the moving comprises transferring the hood to the sting.

In one or more embodiments of any of the other embodiments, the chamber is a deposition chamber and the apparatus further comprises: a loading chamber; and a preheat chamber between the deposition chamber and the loading chamber, the retracting comprising retracting the first part into the loading chamber through the preheat chamber.

In one or more embodiments of any of the other embodiments, the coating passes to the part being coated as a vapor.

In one or more embodiments of any of the other embodiments, the method further comprises: monitoring a power consumption; and responsive to power dropping to a first threshold, performing the moving and replacing.

Another aspect of the disclosure involves a thermal hood for a deposition apparatus, the hood comprises: a plate; a foraminate member spaced apart from the plate and mounted thereto; and means for mounting the thermal hood to a shaft.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 1 is a partial schematic sectional view of a coated part.

FIG. 2 is a partially schematic side/cutaway view of a coating apparatus with fully inserted substrate carrier.

Like reference numbers and designations in the various drawings indicate like elements.

DETAILED DESCRIPTION

Figure 3:
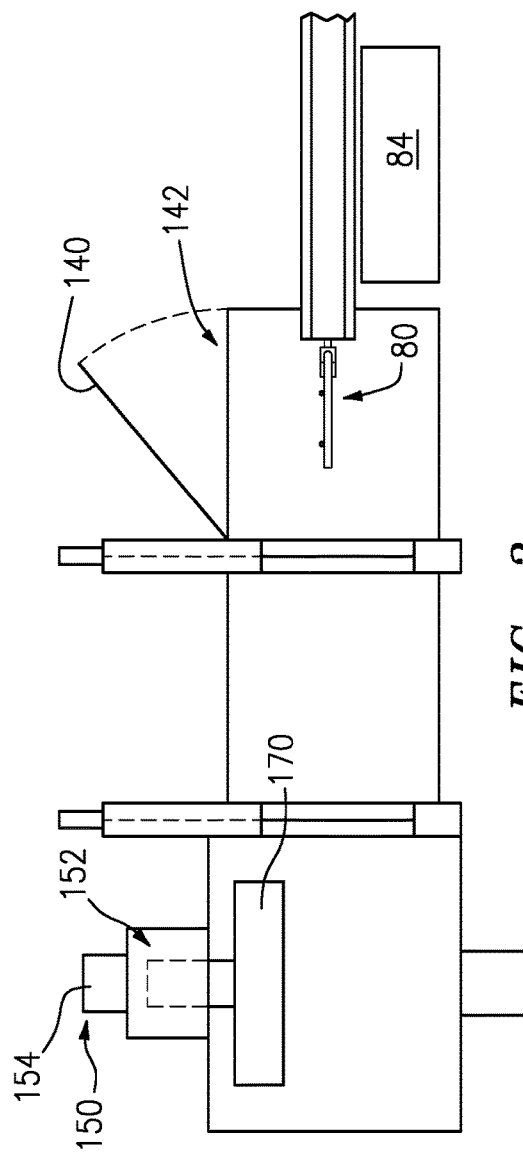
FIG. 3 is a view of the apparatus of FIG. 2 with fully retracted carrier.

FIG. 1 shows a coating system 20 atop a superalloy substrate (the article/component/part that is coated) 22. The system may include a bond coat 24 atop the substrate 22 and a ceramic thermal barrier coating (TBC) 26 atop the bond coat 24. The exemplary bond coat 24 includes a base layer 28 and a thermally-grown oxide (TGO) layer 30. Exemplary substrates are of nickel- or cobalt-based superalloys used for hot gaspath components such as: turbine section blades; turbine section vanes; turbine section blade outer air seals; combustor shell pieces; combustor heat shield pieces; combustor fuel nozzles; and combustor fuel nozzle guides. Exemplary base layer thicknesses are 10-400 micrometers, more narrowly 20-200 micrometers. Exemplary TGO layer thicknesses are 0.05-1.0 micrometers, more narrowly 0.3-0.8 micrometers. Exemplary TBC thicknesses are 40-800 micrometers, more narrowly 100-500 micrometers.

An exemplary coating process includes preparing the substrate (e.g., by cleaning and surface treating). A precursor of the bond coat is applied. An exemplary application is of an MCrAlY, more particularly a NiCoCrAlY material. An exemplary application is via a spray from a powder source. An exemplary application is via a low pressure plasma-spray (LPPS) process. An exemplary application is to a thickness of 0.003-0.010 inch, (76-254 micrometers) more broadly 0.001-0.015 inch (25-381 micrometers). LPPS, VPS, EBPVD, cathodic arc, cold spray, and any other appropriate process may be used.

After the application, the precursor may be diffused. An exemplary diffusion is via heating (e.g., to at least 1900° F. (1038 C) for a duration of at least 4 hours) in vacuum or nonreactive (e.g., argon) atmosphere. The exemplary diffusion may create a metallurgical bond between the bond coat and the substrate. Alternatively diffusion steps may occur after applying the TBC, if at all.

Figure 5:
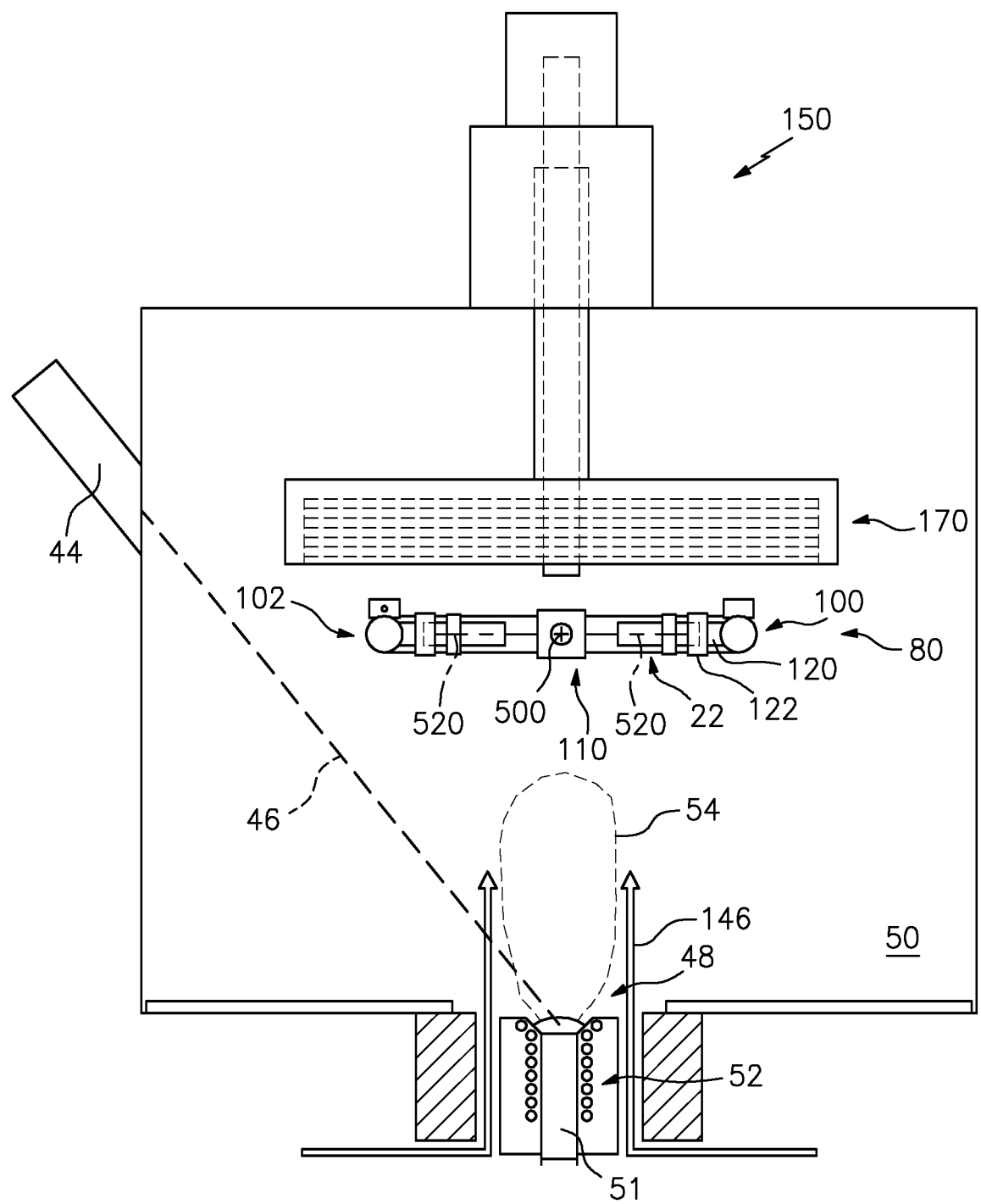
FIG. 5 is a partially schematic transverse sectional view of a deposition chamber of the apparatus of FIG. 2.

After application of the bond coat precursor, if any, the substrate may be transferred to a coating apparatus for applying the TBC 26. An exemplary coating apparatus is an EB-PVD coater. FIG. 2 shows one exemplary EB-PVD coating apparatus/system (coater) 40. The exemplary coater 40 includes a deposition or coating chamber 42. One or more electron guns 44 (FIG. 5) are positioned at the coating chamber 42 to each direct an associated electron beam 46 to a deposition material (or precursor thereof) source 48 in the chamber interior 50. Exemplary material sources 48 comprise respective bodies (e.g., ingots) 51 of ceramic-forming material each in an associated crucible 52. The exemplary material sources are ceramic bodies of the nominal TBC composition (e.g., a yttria-stabilized zirconia or a gadolinia-zirconia such as 7YSZ or 59 wt. % gadolinia, respectively). The electron beams vaporize the material to form vapor clouds or plumes 54 which envelop the parts 22 which are held in a coating position within the chamber 50.

For introducing a reactive gas (e.g., oxygen for combining with the initially vaporated material in the vapor clouds to make up for oxygen lost from the evaporated ceramic) a gas source 55 (FIG. 2) may be provided. Exemplary gas is essentially pure oxygen. The source may be connected to an outlet (e.g., a manifold 56) via a gas line 57 and controlled by a gas valve 58. As is discussed further below, the same electron gun(s) that vaporize the deposition material may be used to heat the coating chamber and, if present, the parts to be coated (e.g., by directing their beam(s) to a bed 59 of refractory ceramic gravel (e.g., also 7YSZ)). This may provide a preheating of the deposition chamber (e.g., both before any coating runs and between coating runs).

For preheating the parts 22, the exemplary system 40 includes a preheat chamber (preheater) 60 (having an interior 61) positioned on a side of the coating chamber 42. Even in the absence of preheating, such a chamber may serve merely as a transfer chamber between the coating chamber 42 and a loading chamber 72 discussed below. A gate valve 62 may be positioned at a proximal end of the preheat chamber 60 (i.e., between the preheat chamber interior 61 and the deposition chamber interior 50). An additional gate valve 64 may be at a distal end of the preheat chamber. The preheat chamber is associated with a loading chamber or station 72 (station or load lock, having an interior 73). The valve 64 is thus between interiors of the preheat chamber and the loading chamber. Each of the valves 62, 64 may, instead, be replaced by multiple valves so as to allow further isolation and allow various alternative couplings of multiple loading chambers and/or multiple preheat chambers. For example, one exemplary such coupling is shown in PCT/US10/58319.

The exemplary loading chamber 72 may have a carrier and drive system/mechanism 74 which, when the appropriate gate valves are open, shift the carried parts into the preheat chamber 60 or all the way into the coating chamber 42. FIG. 2 also shows vacuum sources 76, 77, and 78, respectively, coupled to and associated with the chambers 42, 60, and 72. The exemplary vacuum sources are one or more pumps with associated conduits and valves. Various further options exist for further process gas sources (not shown).

Figure 6:
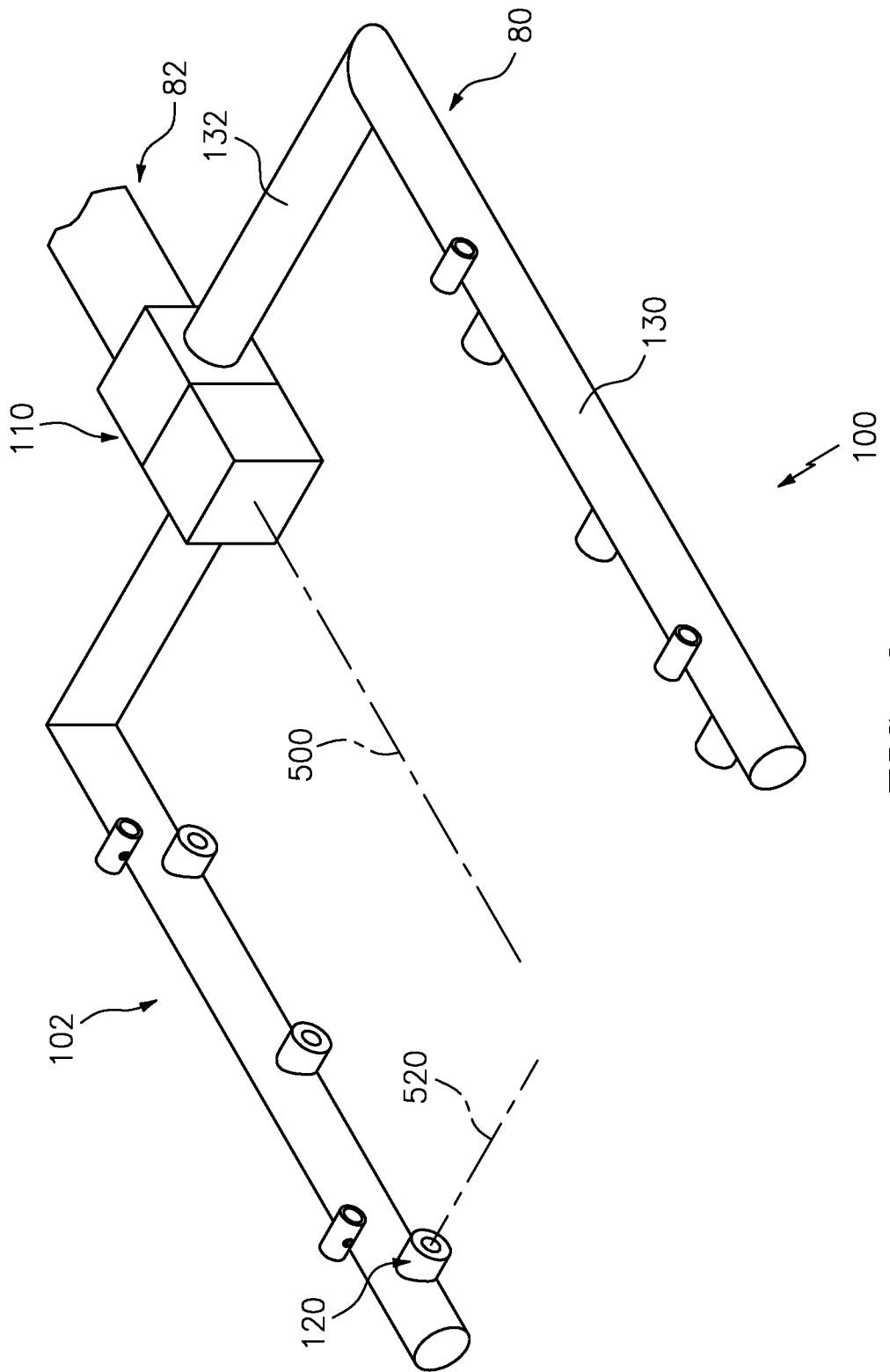
FIG. 6 is a partial, partially schematic, longitudinal cutaway view of the carrier of the apparatus of FIG. 2.

An exemplary carrier and drive system/mechanism 74 may comprise a part carrier/fixture (carrier) 80 (see also, FIG. 6) for holding the parts 22 at one end of a sting assembly (sting) 82. The exemplary carrier reflects a baseline carrier of ALD Vacuum Technologies GmbH, Hanau, Germany. Alternative baselines may be used. A drive mechanism (actuator) 84 may drive the sting assembly. The drive mechanism may have a screw drive mechanism (e.g., electric motor-driven) for longitudinally shifting the sting and carrier in the associated loading chamber. The exemplary carrier 80 carries a group of the parts. The carrier 80 may rotate (e.g., about a longitudinal horizontal axis 500). The drive mechanism may include one or more additional appropriate mechanisms (actuators) (e.g., also electric motors) for driving such rotation. For example, the sting 82 may comprise an outer member 90 and an inner member 92 partially concentrically within the outer member 90. The drive mechanism may be mounted to the outer member 90 to longitudinally shift the outer member (and thereby the carrier 80 and inner member 92). The drive mechanism may also rotate the inner member relative to the outer member about the axis 500. The carrier 80 may be mounted at an inboard end of the inner member 92.

The exemplary carrier 80 is formed as a rake (FIG. 6) having a pair of arms 100, 102 spaced away from the axis 500. In the exemplary embodiment, the illustrated rake condition places the arms diametrically opposite each other. However, in an exemplary implementation, the arms may be rotated relative to each other about the axis 500 (e.g., so as to be other than diametrically opposite). This rotation, provided such as by a tilt head gearbox 110 may allow varying of exposure of portions of the parts 22 to the vapor. Along each of the arms, there are a plurality of part-carrying stations 120 for receiving a part (e.g., directly or via an adapter/holder 122 (FIG. 5)). For example, if the parts 22 are blades, the holder 120 may be complementary to the blade attachment root to allow coating of the blade airfoil and platform.

The exemplary stations 120 may be formed by crown gears configured for rotating the parts about axes 520 (e.g., transverse to and intersecting the axis 500). To drive such rotation, drive shafts (not shown) may pass through longitudinal portions 130 of the arms 100, 102 and be engaged to corresponding shafts (not shown) extending through proximal radial portions 132 to, in turn, be driven by a shaft (not shown) extending through the inner shaft 92. The exemplary sting assembly may comprise several additional concentric shafts (not shown) for controlling the respective actuations. For example, rotation of an innermost shaft may control rotation of parts about the axes 520, rotation of a next outer shaft may control relative position of the arms and the outer shaft 90 may control overall rotation about the axis 500.

A control system 300 (FIG. 2) may include an appropriately configured microcomputer, microcontroller, or other controller being configured by software and/or hardware to perform the methods described herein. The control system may be coupled to the various controllable system components as well as to sensors, input devices for receiving user input, and display devices.

Figure 4:
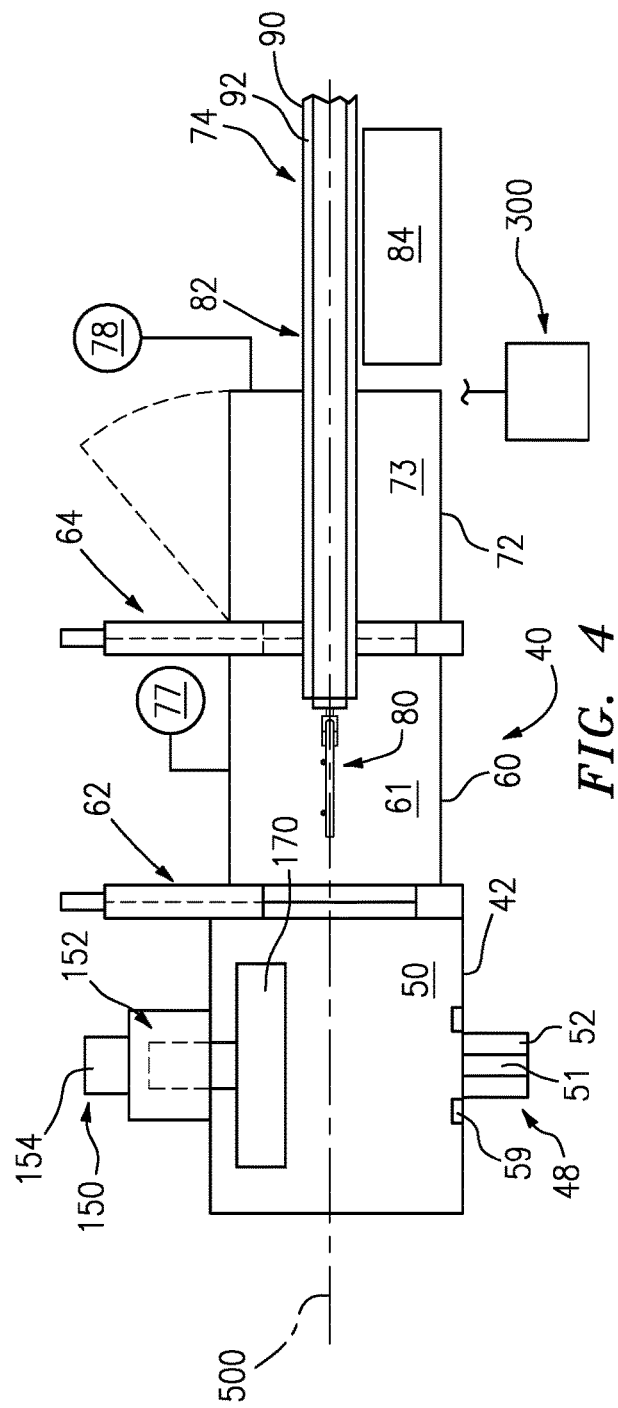
FIG. 4 is a view of the apparatus of FIG. 2 with intermediate position carrier.

FIG. 3 shows a maximally retracted second position of the sting assembly 82. In this condition, the carrier 80 and part(s) are in the loading chamber 72 and may be accessed via one or more doors 140. For purposes of schematic illustration, the exemplary door 140 is shown positioned to close an opening or port 142 at the top of the chamber. However, such doors may alternatively be positioned at one or both sides of the chamber or even below. In the second position, the uncoated parts may be loaded into the loading station and the coated parts removed therefrom (e.g., through the associated port 142 (if present) or gate valve). FIG. 4 shows an intermediate third position with the carrier 80 and part(s) 22 in the preheat chamber 60.

FIG. 2 also shows a thermal hood system 150 having an actuator 152 for raising and lowering a thermal hood. As is discussed further below, a thermal hood system 150 may replace a system having a single thermal hood with a system having multiple thermal hoods which may consecutively be placed into an operative position. In various implementations, this may allow substantially extending the interval between times when the chamber 42 must be cooled and vented (vacuum broken) to enable service.

In one group of examples, operation may viewed starting with a clean coating chamber 42 and fresh plurality of thermal hoods. As repeated coating cycles occur, coating material will build up on the chamber walls and on the particular thermal hood in the operative position. For ceramic coatings, this build-up further insulates the chamber and makes operations more thermally efficient, reducing the electron beam gun current required to maintain deposition temperature. At some point, when the current is low enough, vaporization of the coating source becomes inadequate. Accordingly, at a particular threshold, it is desirable to replace the existing thermal hood in the operative position with another thermal hood. For example, the controller 300 may determine this condition when the electron beam gun current drops to a particular value.

Figure 7A:
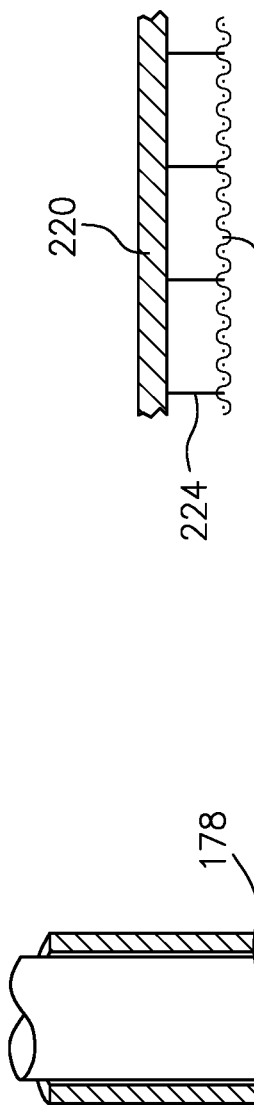
FIG. 7A is an enlarged partially schematic view of a hood.
Figure 7:
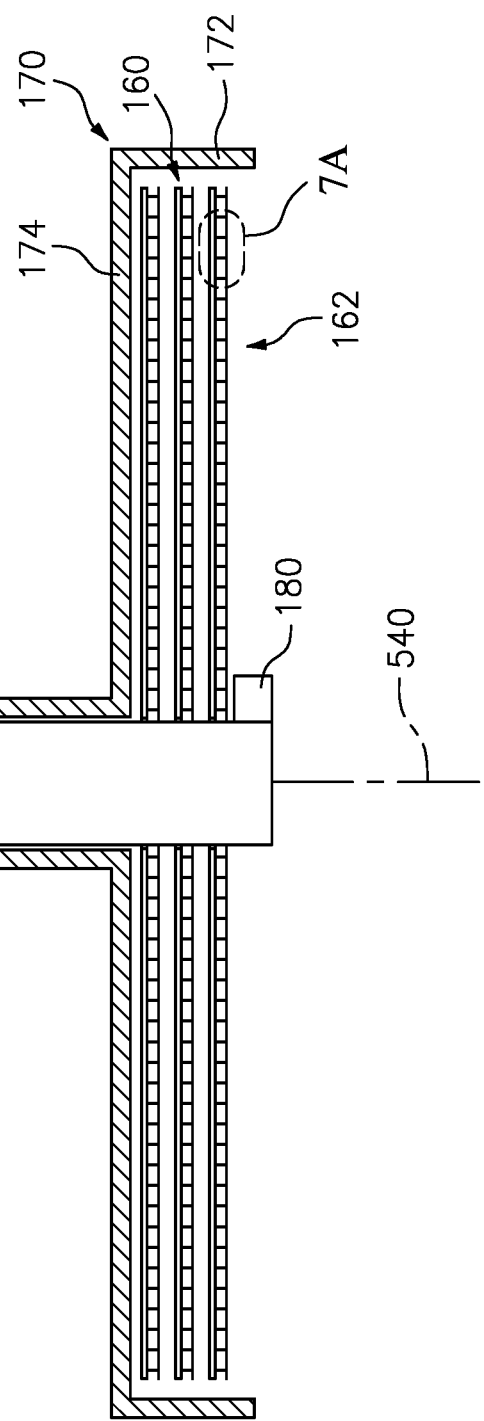
FIG. 7 is an enlarged partially schematic view of a hood frame and hood supply.

As noted above, exemplary system 150 has a supply of thermal hoods. FIG. 7 shows an exemplary supply of thermal hoods in the form of a vertical array 160 of individual hood assemblies (hoods) 162. In this example, the lowermost hood is in the operative position. The exemplary hoods are formed essentially as flat plate assemblies. Alternative hoods may have a more arcuate form.

Figure 8:
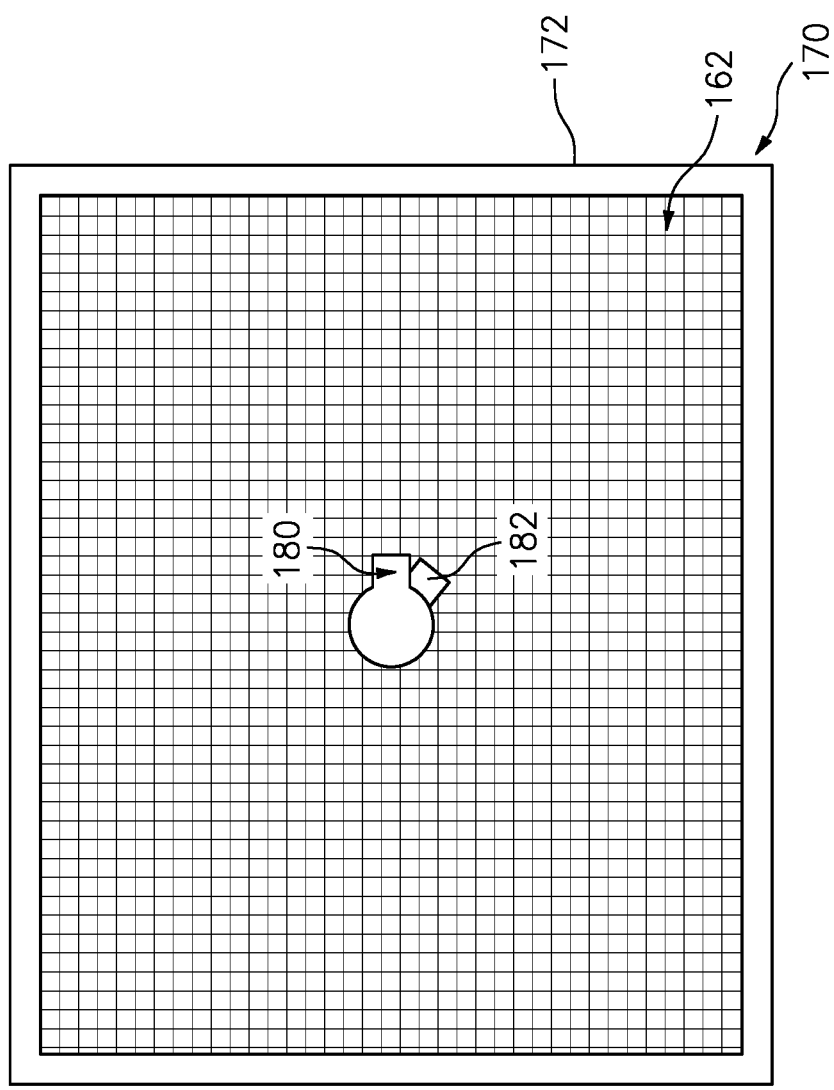
FIG. 8 is a bottom view of the hood frame and hood supply of FIG. 7.

The exemplary hoods 162 have a generally rectangular planform (FIG. 8). Exemplary hoods are held within a frame structure 170 having a footprint complementary to the hood planform. The frame structure 170 includes a sidewall 172 and an upper web 174 (FIG. 7). The upper web 174 may be secured to an outer shaft 176 which, in turn, is vertically shiftable by the actuator 152 to raise or lower the hood frame and hood supply.

Figure 10:
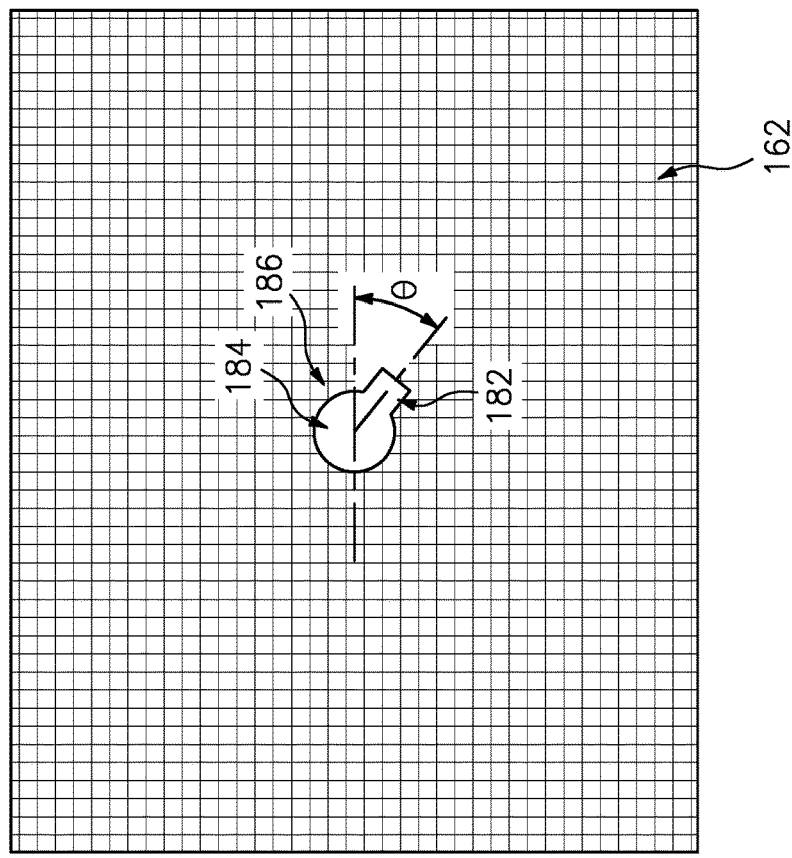
FIG. 10 is a bottom view of a second hood.
Figure 9:
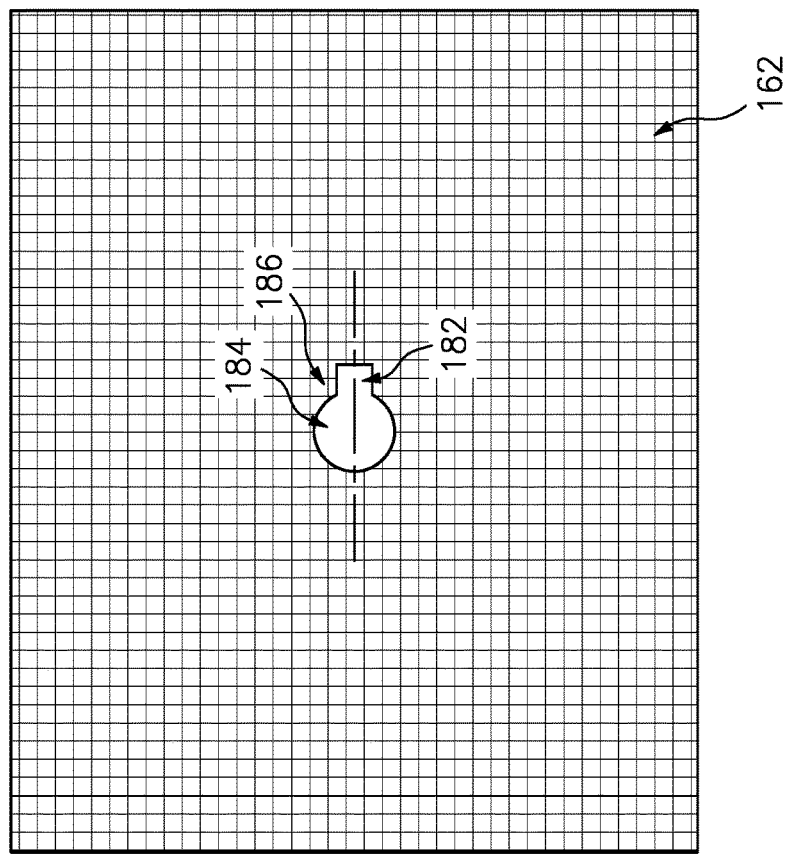
FIG. 9 is a bottom view of a first hood.

An inner shaft 178 extends within the outer shaft 176 and supports the array 160 of hoods 162. The shaft 178 may be actuated to rotate about an axis 540 (e.g., via a rotary actuator 154 (FIG. 2)) to release a hood 162 from the operative position and allow a fresh hood to shift into the operative position. An exemplary release mechanism operates by a keying feature 180 (e.g. a radial protrusion) at the lower end of the inner shaft 178 selectively cooperating with openings 184 (FIG. 9) in the hoods. For example, each of the hoods may have an aperture 184 with a central circular portion and the portion 182 extending radially therefrom. FIG. 9 shows a first hood with an aperture 182 at a first orientation. FIG. 10 shows a second hood with an aperture 182 angularly offset from the position of the first hood by angle θ. A plurality of the first and second hoods may be alternatingly stacked in the array 160. To sequentially dispense hoods, the actuator 154 may successively rotate the inner shaft 178 between a first position wherein the projection 180 is aligned with opening portions 182 in the first hoods and then a second condition wherein it is aligned with opening portions 182 in the second hoods.

Accordingly, in this example, if the hood 162 of FIG. 8 and FIG. 9 is one of the first hoods, the FIG. 8 keying feature 180 is in the second condition. An upper surface of the keying feature 180 contacts an intact portion 186 of the lowermost hood aside the opening portion 182 so as to support the lowermost hood in the operative position and the remaining hoods stacked thereatop. If, when viewed from below, the inner shaft 178 is rotated by the angle θ clockwise to the first condition, the lowermost hood in the operative position is freed to fall from or otherwise be released from the inner shaft 178 with the keying feature 180 passing through the opening portion 182. With the keying feature 180 aligned with the opening portions 182 of the first plates, the next plate in the stack, being one of the second plates will move downward but its motion will be stopped by the intact portion 186 contacting the keying feature 180 upper surface. Removal of the expended/released hood is discussed below. It is accordingly seen that a rotation back counterclockwise to the FIG. 8 condition would release the new lowermost hood and so on.

An alternative configuration simply involves having the shaft 178 externally threaded and cooperating with internal threads on bosses of the hoods. The release would be via a simple unscrewing action by the actuator 154. In that situation, the actuator 154 would have a continuous rotation in one direction by increments corresponding to the on-center spacing of the hoods in view of the thread pitch.

The exemplary hoods involve the combination of an outer member or layer (outer hood) 220 (FIG. 7A) and an inner member or layer (liner or inner hood) 222. The thermal hood may serve to maintain the effective coating temperature surrounding the parts during their coating process. In the exemplary configuration, the outer hood layer is a generally upper layer and the inner hood layer is a generally lower layer.

In operation, a thermal hood is subject to coating by the deposition material. This may degrade coating rate or cause coating defects due to ceramic building up and flaking off and landing on the part(s). Performance degradation can eventually necessitate removal and replacement of the thermal hood. This may be a cumbersome process with prior art hoods. The exemplary inner member 222 effectively forms a liner representing but a portion of the total thermal mass of the hood (e.g., less than half). As is discussed further below, an exemplary inner member 222 may be foraminate such as formed from bent perforated sheet stock of a steel or a nickel-based superalloy or a wire mesh of such material. The outer member 220 may represent a thicker, relatively less perforated, piece of a similar alloy (e.g., machined plate stock or a casting). The inner member may be secured to the outer member such as via by wires 224 and/or standoffs.

Respective thicknesses of outer member 220 and inner member 222 between the inboard and outboard surfaces are $T_O$ and $T_I$. These, as well as the other parameters, may be measured by an appropriate average (e.g., either mean, median, or modal). Exemplary $T_I$ is 2.5-8 mm, more narrowly, 5-6.5 mm. Exemplary $T_O$ is 5-16 mm, more narrowly, 10-14 mm.

The exemplary sequence of operation may start with clean/new hoods installed in a clean deposition chamber 42. The deposition chamber is pumped down to appropriate pressure conditions (vacuum) and heated to appropriate temperature conditions. Similarly, the preheat chamber may be heated to initial conditions by a heater (not shown). The end of the sting may initially be in the loading chamber without the carrier 80. In this example, a plurality of carriers 80 are alternated to allow high throughput. In alternative embodiments, a single carrier 80 may be used and parts 22 installed and removed therefrom without removing the carrier from the sting. Thus, parts may be pre-installed onto a carrier and several carriers may be used sequentially to speed production. The pre-loaded carrier may be installed to the inner sting shaft 92.

The door 140 may be closed and the loading chamber 72 pumped down to an appropriate condition whereafter the gate valve 64 is opened and the sting shaft assembly inserted to move the carrier into the preheat chamber 60. After appropriate preheating and any further pumpdown of the preheat chamber 60, the gate valve 62 may be opened and the carrier 80 inserted into the deposition chamber and the coating process commenced. After completion of the coating process, the carrier 80 may be retracted back into the preheat chamber 60 and the gate valve 62 closed. In that extraction or after closing the gate valve 62, the carrier 80 may be further extracted into the loading chamber 72. The gate valve 64 may be closed and the loading chamber 72 vented to atmosphere. Thereafter, the door 140 may be opened. The carrier may be removed and replaced with a fresh carrier 80 (e.g., pre-loaded with parts 22).

This process may be repeated a plurality of times. Eventually the required current will drop to the aforementioned threshold. This may cause the controller 300 to alert a technician to begin a hood changeover or the controller may initiate an automatic hood changeover. In the exemplary implementation, the changeover involves using a hood receiving apparatus (catcher) on the sting. The sting is inserted with the hood catching apparatus and without parts. The vertical actuator 154 may lower the array of hoods into close proximity to the catcher to reduce or eliminate any impact of dropping. Thereafter, the rotary actuator 154 rotates the shaft by the associated increment to release the lowermost hood. The actuator 152 may then raise the remaining hoods leaving a clean fresh hood in the lowermost position. The sting may be withdrawn with the expended (fouled) hood.

The expended hood may be removed from the loading chamber 72. The expended hood may further be discarded and/or cleaned or otherwise reconditioned before reuse.

Figure 11:
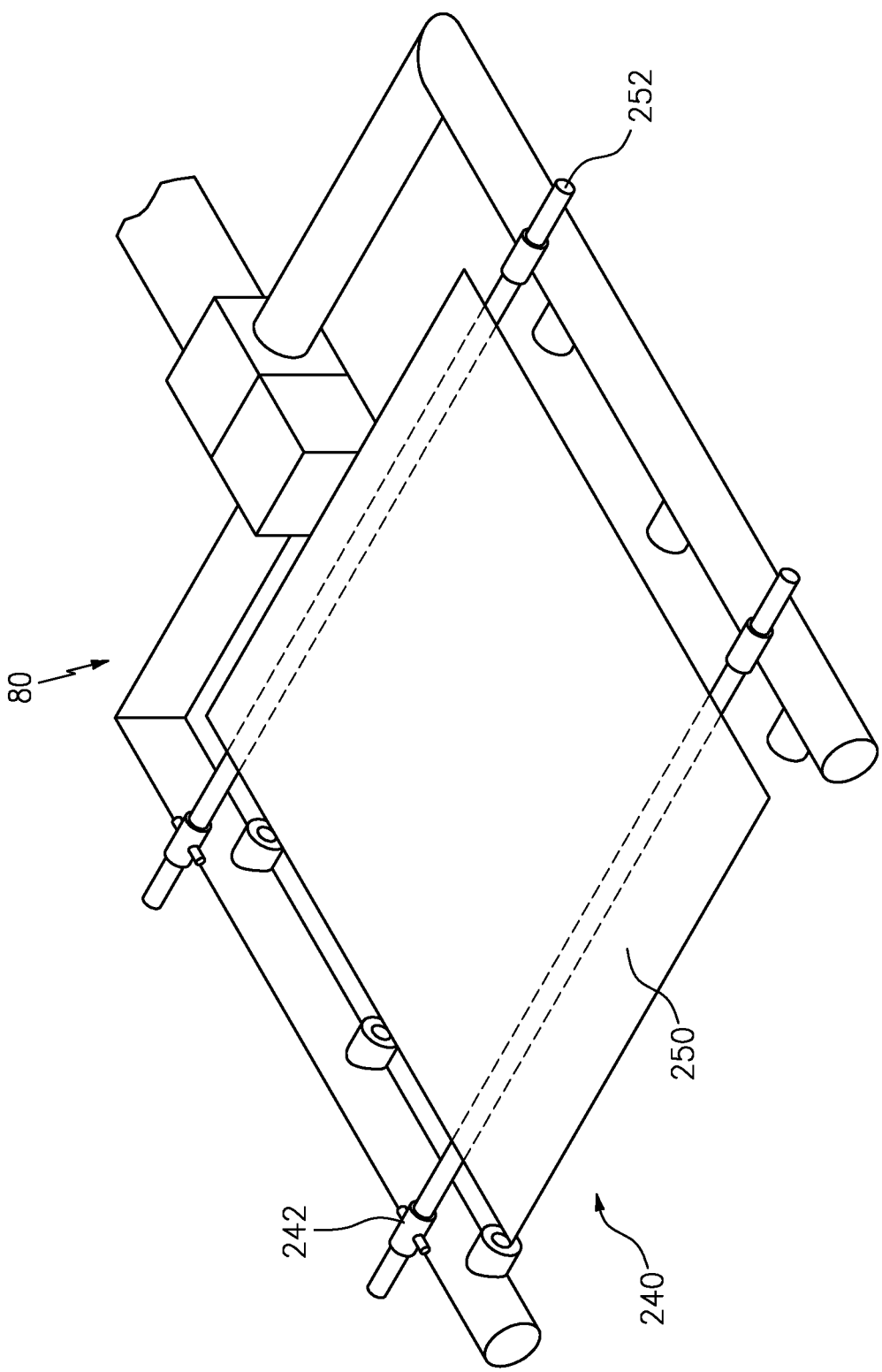
FIG. 11 is a view of a carrier bearing a hood support attachment.

FIG. 11 shows an example of a hood receiving apparatus as a modified carrier 80. Specifically, the exemplary carrier 80 arms 100, 102 are modified to include features for receiving a hood support attachment (receptacle) 240. Exemplary features are a pair of tubular receptacles 242 on each of the arms 100, 102 (e.g., welded atop the arms and pointing with their axes aligned with each other when the arms are in a neutral horizontally extended condition). Thus, one receptacle 242 on the first arm is coaxial with one on the second arm and the second receptacle on the first arm is coaxial with the second receptacle on the second arm. The exemplary support attachment 240 comprises a central plate 250 and four shafts 252 extending outward from the plate (e.g., welded to an underside thereof) at positions corresponding to the receptacles 242. The shafts 252 may be slid into the receptacles 242 (e.g., first on one side and then shifted back to the other side). The attachment 240 may be secured in place such as via a cotter or other pin locking at least one of the shafts 252 to the associated receptacle 242. Such a configuration is particularly useful when the carrier is not removable or only a single carrier is used.

The cycle is repeated until the last hood in the stack is expended. At that point, there may be several options. One option (which may occur without cooling the coating chamber 42 and breaking its vacuum) is to restock the hoods via essentially the reverse of the hood extraction process. For example, one-by-one the clean/new/replacement hoods may be inserted on the carrier and adapter 240 and the actuators 152 and 154 used to acquire the hoods. Depending upon implementation, a stack of hoods may be installed at once or via successive insertions and extractions of the sting.

In other implementations, the hood replenishment may correspond with a more comprehensive servicing (e.g., cleaning) of the coating chamber requiring breaking the vacuum and cooling down (e.g., to ambient conditions).

The various such replacement cycles may allow for some combination of group uniformity, reduced cycle time, and reduced cost. For example, consider a baseline system with a single hood wherein hood replacement occurs at a given threshold of power. The high cost of downtime of hood replacement may induce the user to allow very little margin. This may entail a relatively high variance in coating quality from the first run to the last with a given hood. By having a plurality of hoods, one might choose a higher threshold current so that there is less quality variation between the first and last use of a given hood (even without regard to spalling/contamination discussed hereafter). Also, the chance of spalling of deposits from a hood increases with deposit thickness and the number of thermal cycles the hood experiences. The replacement of hoods from the supply (array 160) vs. replacing a single hood allows replacement at a lesser level of coating accumulation and/or cycles to reduce spalling/contamination chances. Such thermal cycles include the normal cycling and special circumstances. An example of the latter is a failure of some component requiring a full cooldown and vacuum braking for service. In one example, this may occur when a given hood in the supply is only 25% expended/fouled. There may be relatively little cost to just swapping that out for the next one in the supply 160 vs. replacing a similarly expended/fouled single hood.

Alternative hoods are shaped as sectors of circular cylindrical shells. Hoods with a substantial arc will require a relatively large vertical spacing. Thus, for example, it may be impractical to stack hoods with an arc of more than approximately 60°. If arcuate hoods with a significant arc are desired, one possibility is to place such hoods on a carousel (e.g., three or four hoods facing radially outward from a horizontal axis of rotation of the carousel). Instead of removing each expended hood, the carousel may simply rotate a new hood into the operative position until all the hoods have been expended. Rotation may be via a rotary actuator. However, one group of embodiments eliminates a rotary actuator. This avoids the need to penetrate the wall of the coating chamber 42. The carousel may include a plurality of levers which may be contacted by a carrier to increment the rotation of the carousel. For example, instead of the attachment 240, a protruding bar may be attached to the carrier 80 to contact one of the levers upon insertion so that the insertion just indexes/increments the carousel by one hood. The carrier may be retracted and the bar removed and fresh parts installed.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

Several embodiments have been described. Nevertheless, it will be understood that various modifications may be made. For example, and applied as a reengineering of an existing coating apparatus and process, details of the existing apparatus and/or process (in view of the particular coating and substrate) may influence or dictate details of any particular implementation. Accordingly, other embodiments are within the scope of the following claims.

What is claimed is:

1. A method for using an apparatus to deposit a coating on parts, the apparatus comprising:
    a chamber;
    a source of the coating material, positioned to communicate the coating material to the part in the chamber; and
    a plurality of thermal hoods,
the method comprising, while continuously maintaining vacuum in the chamber, a plurality of operational cycles each comprising:
    a plurality of part coating cycles, each comprising:
        installing one or more of the parts to a sting assembly in a retracted condition;
        shifting the sting assembly to an inserted condition;
        coating the one or more parts;
        after the coating, retracting the sting assembly from the inserted condition to the retracted condition; and
        removing the one or more parts; and
    moving a hood from an operative position and replacing it with another hood of the plurality of hoods.

2. The method of claim 1 wherein:
the moving comprises transferring the hood to the sting.

3. The method of claim 1 wherein the chamber is a deposition chamber and the apparatus further comprises:
    a loading chamber; and
    a preheat chamber between the deposition chamber and the loading chamber, the retracting comprising retracting the first part into the loading chamber through the preheat chamber.

4. The method of claim 1 wherein:
the coating passes to the part being coated as a vapor.

5. The method of claim 1 further comprising:
monitoring a power consumption; and
responsive to power dropping to a first threshold, performing the moving and replacing.

6. The method of claim 1 wherein:
the source comprises an ingot and an electron source positioned to direct a beam to the ingot.

7. The method of claim 1, the apparatus further comprising:
    a sting assembly for carrying the one or more parts and shiftable between:
        an inserted condition where the sting assembly holds the one or more parts within the chamber for coating; and
        a retracted condition where the sting assembly holds the one or more parts outside of the chamber.

8. The method of claim 1 wherein:
the moving comprises transferring the hood to the sting assembly.

9. The method of claim 7 wherein:
the sting assembly comprises:
    an inner member and an outer member; and
    an actuator coupled to the inner member to move the inner member relative to the outer member, and wherein:
        the one or more parts are held by the inner member.

10. The method of claim 1 wherein:
the plurality of thermal hoods are in a vertical array; and
the operative position is a lowermost position in the array.

11. The method of claim 1 wherein:
the apparatus comprises a means for said moving, the means comprising a rotatable shaft extending through the plurality of thermal hoods.

12. The method of claim 11 wherein:
the means provides height adjustment of the operative position.

13. The method of claim 11 wherein:
the rotatable shaft is keyed to the plurality of thermal hoods so that sequential rotations of the rotatable shaft sequentially release the hoods from the operative position.

14. The method of claim 1 wherein the thermal hoods each comprise:
a first member comprising an essentially continuous metallic member; and
a second member comprising a foraminate layer spaced below the first metal member.

15. The method of claim 14 wherein:
the first member and second member are secured by wires and/or standoffs.

16. The method of claim 14 wherein:
the first member comprises a plate.

17. The method of claim 16 wherein:
the second member comprises a screen.

18. A method for using an apparatus to deposit a coating on parts, the apparatus comprising:
a chamber;
a source of the coating material, positioned to communicate the coating material to the part in the chamber; and
a plurality of thermal hoods,
the method comprising:
monitoring a power consumption; and
while continuously maintaining vacuum in the chamber, a plurality of operational cycles each comprising:
a plurality of part coating cycles; and
responsive to power dropping to a first threshold, moving a hood from an operative position and replacing it with another hood of the plurality of hoods.

19. A method for using an apparatus to deposit a coating on parts, the apparatus comprising:
a chamber;
a source of the coating material, positioned to communicate the coating material to the part in the chamber;
a plurality of thermal hoods; and
means for moving a hood from an operative position and replacing it with another hood of the plurality of thermal hoods, the means comprising a rotatable shaft extending through the plurality of thermal hoods, wherein the means provides height adjustment of the operative position,
the method comprising, while continuously maintaining vacuum in the chamber, a plurality of operational cycles each comprising:
a plurality of part coating cycles; and
moving a hood from said operative position and replacing it with another hood of the plurality of hoods.

* * * * *